(12) United States Patent
Gai et al.

(10) Patent No.: US 12,733,346 B2
(45) Date of Patent: Sep. 8, 2026

(54) ORGANIC LIGHT EMITTING DIODE DISPLAY PANEL, MANUFACTURING METHOD THEREOF, AND DISPLAY DEVICE

(71) Applicant: BOE Technology Group Co., Ltd., Beijing (CN)

(72) Inventors: Renrong Gai, Beijing (CN); Shantao Chen, Beijing (CN); Zunqing Song, Beijing (CN); Dengyun Chen, Beijing (CN); Jing Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 18/280,590

(22) PCT Filed: Jul. 29, 2022

(86) PCT No.: PCT/CN2022/108895
§ 371 (c)(1),
(2) Date: Sep. 6, 2023

(87) PCT Pub. No.: WO2024/021006
PCT Pub. Date: Feb. 1, 2024

(65) Prior Publication Data
US 2025/0040350 A1 Jan. 30, 2025

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/80522* (2023.02)

(58) Field of Classification Search
CPC ............ H10K 59/122; H10K 59/1201; H10K 59/80522
See application file for complete search history.

(56) References Cited

U.S. PATENT DOCUMENTS

2007/0069639 A1 3/2007 Noh et al.
2013/0001603 A1 1/2013 Lim et al.
(Continued)

FOREIGN PATENT DOCUMENTS

CN 1941400 A 4/2007
CN 106057845 A 10/2016
(Continued)

*Primary Examiner* — Anne M Hines
(74) *Attorney, Agent, or Firm* — Banner & Witcoff, Ltd.

(57) ABSTRACT

An organic light emitting diode display panel, a manufacturing method thereof and a display device are provided, the organic light emitting diode display panel includes: a pixel defining layer, which includes a first opening, a second opening and a pixel defining structure between the first opening and the second opening, the first opening is provided with a light emitting layer and a first electrode which are stacked, the second opening is not provided with the light emitting layer; a first lateral edge of the pixel defining structure adjacent to the first opening forms a first included angle with a plane parallel to a main surface of the base substrate, and a second lateral edge of the pixel defining structure adjacent to the second opening forms a second included angle with a plane parallel to the base substrate, the first included angle is smaller than the second included angle.

18 Claims, 8 Drawing Sheets

(56) References Cited

U.S. PATENT DOCUMENTS

2014/0312323 A1* 10/2014 Park ................. H10K 59/80516 438/23
2014/0361253 A1 12/2014 Choi et al.
2015/0008398 A1* 1/2015 Lee .................. H10K 59/80522 438/35
2015/0097171 A1* 4/2015 Kim ................. H10K 59/80522 438/23
2016/0306472 A1 10/2016 Park et al.
2016/0351636 A1 12/2016 Lee et al.
2017/0033166 A1* 2/2017 Shim .................. H10K 59/1201
2019/0229152 A1 7/2019 Wang
2020/0043996 A1 2/2020 Cheng
2020/0273926 A1 8/2020 Lee
2021/0013452 A1 1/2021 Kim et al.
2021/0083190 A1 3/2021 Qu et al.
2021/0336235 A1 10/2021 Zhang
2021/0367015 A1 11/2021 Kim et al.
2022/0085331 A1 3/2022 Yoo et al.

FOREIGN PATENT DOCUMENTS

CN 106206646 A 12/2016
CN 207052608 U 2/2018
CN 109103215 A 12/2018
CN 109103229 A 12/2018
CN 110047886 A 7/2019
CN 110571361 A 12/2019
CN 111613643 A 9/2020
CN 112216726 A 1/2021
CN 113261127 A 8/2021
CN 113725261 A 11/2021
CN 113937142 A 1/2022

* cited by examiner

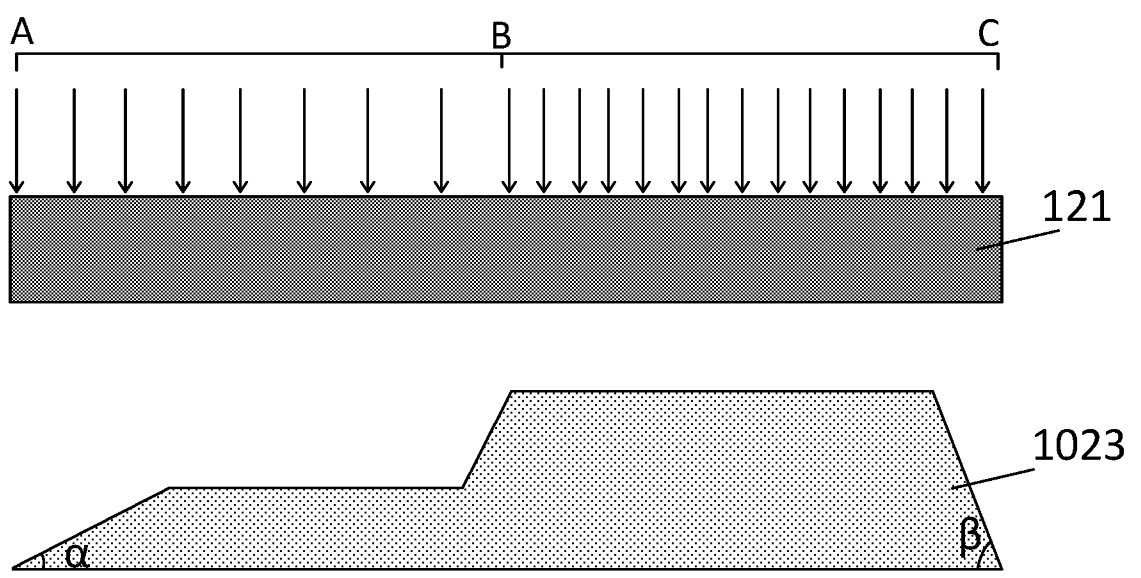
Fig. 9B
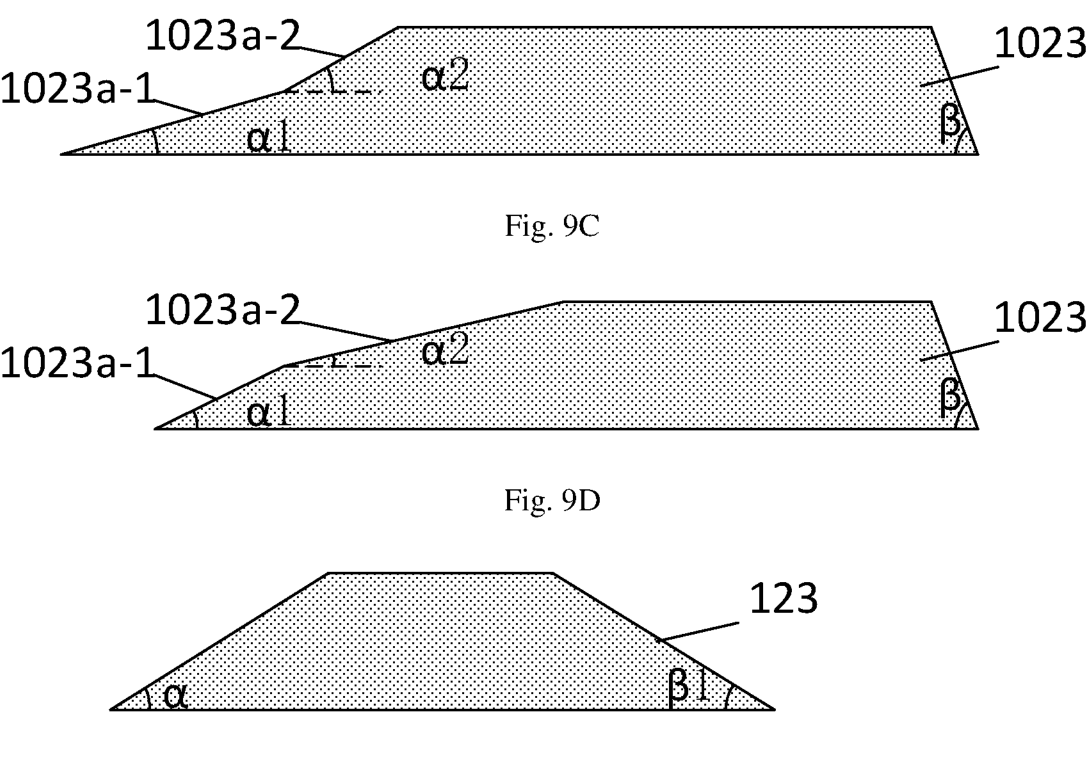
Fig. 9C
Fig. 9D
Fig. 10A

ORGANIC LIGHT EMITTING DIODE DISPLAY PANEL, MANUFACTURING METHOD THEREOF, AND DISPLAY DEVICE

This application is a U.S. National Phase Entry of International Application No. PCT/CN2022/108895 filed Jul. 29, 2022, designating the United States of America. The present application claims priority to and the benefit of the above-identified application and the above-identified application is incorporated by reference herein in its entirety.

TECHNICAL FIELD

The present disclosure relates to an organic light emitting diode display panel, a manufacturing method thereof, and a display device.

BACKGROUND

Organic light emitting diode (OLED) display device has become a research hotspot in the field of photoelectric display technology because of its advantages of self-luminescence, wide viewing angle, high contrast, low power consumption, fast response speed, lightweight and ultra-thin, good screen flexibility and simple manufacturing process.

Generally, an organic light emitting diode includes a lower electrode, a light emitting layer, an organic functional layer, and an upper electrode which are stacked. For example, the light emitting layer may be formed in an opening included in a pixel defining layer, and the organic functional layer may be formed on the lower electrode (for example, anode) and the upper surface of the pixel defining layer. The organic functional layer may include a hole injection layer, a hole transport layer, a hole blocking layer, an electron transport layer, an electron injection layer and so on, which are sequentially stacked, and the light emitting layer may be arranged between the hole transport layer and the hole blocking layer. Other layer structures can be formed on the organic functional layer, such as the upper electrode (for example, cathode) and the like.

SUMMARY

At least one embodiment of the present disclosure provides an organic light emitting diode display panel, a manufacturing method thereof and a display device, the organic light emitting diode display panel makes a first included angle between a first lateral edge of a pixel defining structure adjacent to a first opening and a plane parallel to a main surface of a base substrate smaller than a second included angle between a second lateral edge of the pixel defining structure adjacent to a second opening and the plane parallel to the main surface of the base substrate, so as to simultaneously solve the problems of resolution reduction and color shift during the light mixing process caused by the arrangement of auxiliary electrode.

At least one embodiment of the present disclosure provides an organic light emitting diode display panel, and the organic light emitting diode display panel comprises: a base substrate; and a pixel defining layer, arranged on the base substrate, the pixel defining layer comprises a first opening, a second opening and a pixel defining structure between the first opening and the second opening, the first opening is provided with a light emitting layer and a first electrode which are stacked, and the second opening is not provided with the light emitting layer, a first lateral edge of the pixel defining structure adjacent to the first opening forms a first included angle with a plane parallel to a main surface of the base substrate, and a second lateral edge of the pixel defining structure adjacent to the second opening forms a second included angle with the plane parallel to the main surface of the base substrate, and the first included angle is smaller than the second included angle.

For example, in the organic light emitting diode display panel provided by at least one embodiment of the present disclosure, an auxiliary electrode electrically connected with the first electrode is arranged in the second opening, the first electrode extends from the first opening to the second opening, and the first electrode is spaced apart from the auxiliary electrode in the second opening.

For example, in the organic light emitting diode display panel provided by at least one embodiment of the present disclosure, at least one side of the first electrode located in the second opening away from the base substrate is provided with a metal oxide conductive layer, and the metal oxide conductive layer covers at least a lateral surface of the auxiliary electrode, so that the first electrode and the auxiliary electrode are electrically connected through the metal oxide conductive layer.

For example, in the organic light emitting diode display panel provided by at least one embodiment of the present disclosure, the first electrode is at a side of the light emitting layer away from the base substrate, and the metal oxide conductive layer is arranged at a side of the first electrode away from the base substrate in the first opening and the second opening, and the metal oxide conductive layer extends from the first opening to the second opening, and covers a lateral surface of the auxiliary electrode and a surface of the auxiliary electrode away from the base substrate.

For example, in the organic light emitting diode display panel provided by at least one embodiment of the present disclosure, a first sub-electrode is arranged between the auxiliary electrode and the metal oxide conductive layer, and the first sub-electrode and the first electrode are formed in the same process step.

For example, in the organic light emitting diode display panel provided by at least one embodiment of the present disclosure, in the first opening, a first organic functional layer is arranged at a side of the first electrode close to the base substrate, the first organic functional layer extends from the first opening to the second opening, and the first organic functional layer and the auxiliary electrode are spaced part from each other in the second opening, a second organic functional layer is arranged at a side of the auxiliary electrode away from the base substrate, and the first organic functional layer and the second organic functional layer are formed in the same process step.

For example, in the organic light emitting diode display panel provided by at least one embodiment of the present disclosure, a second electrode is arranged at a side of the light emitting layer close to the base substrate, a thin film transistor is arranged at a side of the second electrode close to the base substrate, and a planarization layer is arranged between the second electrode and the thin film transistor, and the second electrode is electrically connected with a first source-drain electrode of the thin film transistor through a first via hole structure arranged in the planarization layer.

For example, in the organic light emitting diode display panel provided by at least one embodiment of the present disclosure, the planarization layer is arranged in the second opening, and the auxiliary electrode is arranged at a side of the planarization layer away from the base substrate.

For example, in the organic light emitting diode display panel provided by at least one embodiment of the present disclosure, a thickness of the planarization layer in a direction perpendicular to the base substrate is greater than a thickness of the pixel defining layer in the direction perpendicular to the base substrate, and a lateral edge of the planarization layer adjacent to the second opening forms a third included angle with a plane parallel to the main surface of the base substrate, and the third included angle is greater than the second included angle.

For example, in the organic light emitting diode display panel provided by at least one embodiment of the present disclosure, a lateral edge of the planarization layer adjacent to the second opening forms a third included angle with a plane parallel to the main surface of the base substrate, and the third included angle is equal to the second included angle.

For example, in the organic light emitting diode display panel provided by at least one embodiment of the present disclosure, a distance between a part of an orthographic projection of the lateral edge of the planarization layer adjacent to the second opening on the base substrate farthest from the first opening and a part of an orthographic projection of the second lateral edge of the pixel defining structure on the base substrate farthest from the first opening is greater than 0.

For example, in the organic light emitting diode display panel provided by at least one embodiment of the present disclosure, the first lateral edge comprises a first sub-edge and a second sub-edge which are sequentially arranged in a direction away from the base substrate, and the first sub-edge forms a fourth included angle with a plane parallel to the main surface of the base substrate, and the second sub-edge forms a fifth included angle with a plane parallel to the main surface of the base substrate, and the fourth included angle is greater than the fifth included angle, the fourth included angle is equal to the first included angle.

For example, in the organic light emitting diode display panel provided by at least one embodiment of the present disclosure, the auxiliary electrode comprises a titanium metal layer, an aluminum metal layer and a titanium metal layer which are stacked.

For example, in the organic light emitting diode display panel provided by at least one embodiment of the present disclosure, an orthographic projection of the aluminum metal layer on the base substrate is within an orthographic projection of the titanium metal layer on the base substrate.

For example, in the organic light emitting diode display panel provided by at least one embodiment of the present disclosure, a plurality of first openings are provided, and colors of light emitted by light emitting layers in adjacent ones of the plurality of first openings are different.

For example, in the organic light emitting diode display panel provided by at least one embodiment of the present disclosure, the first included angle ranges from 20° to 40°, and the second included angle ranges from 65° to 90°.

For example, in the organic light emitting diode display panel provided by at least one embodiment of the present disclosure, the second opening is a transparent display region, and the pixel defining layer is not provided in the second opening.

For example, in the organic light emitting diode display panel provided by at least one embodiment of the present disclosure, a fingerprint recognition sensor is arranged in the second opening.

At least one embodiment of the present disclosure further provides a display device, and the display device comprises any one of the organic light emitting diode display panels mentioned above.

At least one embodiment of the present disclosure further provides a manufacturing method of an organic light emitting diode display panel, and the manufacturing method comprises: providing a base substrate; forming a pixel defining layer on the base substrate, wherein the pixel defining layer comprises a first opening, a second opening and a pixel defining structure between the first opening and the second opening; sequentially forming a light emitting layer and a first electrode in the first opening; wherein the second opening is not provided with the light emitting layer; a first lateral edge of the pixel defining structure adjacent to the first opening forms a first included angle with a plane parallel to a main surface of the base substrate, and a second lateral edge of the pixel defining structure adjacent to the second opening forms a second included angle with the plane parallel to the main surface of the base substrate, and the first included angle is smaller than the second included angle.

For example, the manufacturing method provided by at least one embodiment of the present disclosure, further comprises: forming an auxiliary electrode electrically connected with the first electrode in the second opening.

For example, in the manufacturing method provided by at least one embodiment of the present disclosure, forming the pixel defining layer comprises exposing a pixel defining film by using a mask plate to form the first opening, the second opening and a pixel defining structure film layer between the first opening and the second opening, and an exposure energy of a part of the pixel defining structure film layer adjacent to the first opening is smaller than an exposure energy of a part of the pixel defining structure film layer adjacent to the second opening to form a pixel defining structure precursor with a stepped shape.

For example, the manufacturing method provided by at least one embodiment of the present disclosure, further comprises: performing a heat treatment on the pixel defining structure precursor with the stepped shape, wherein the heat treatment comprises placing the pixel defining structure precursor with the stepped shape having a first temperature in a heating device, and raising the temperature of the pixel defining structure precursor to a second temperature in the heating device.

For example, in the manufacturing method provided by at least one embodiment of the present disclosure, forming the pixel defining layer comprises: forming the first opening, the second opening and a pixel defining structure film layer between the first opening and the second opening by a first patterning process, and performing a second patterning process on a part of the pixel defining structure film layer adjacent to the second opening to form the pixel defining structure.

BRIEF DESCRIPTION OF DRAWINGS

In order to illustrate the technical solutions of the embodiments of the present disclosure clearer, the drawings of the embodiments will be briefly described.

Obviously, the drawings in the following only relate to some embodiments of the present disclosure, and are not intended to limit the present disclosure.

FIGS. 8A-8B are schematic diagrams of a formation process of a pixel defining layer provided by at least one embodiment of the present disclosure;

FIGS. 9A-9C are schematic views of a formation process of another pixel defining layer provided by at least one embodiment of the present disclosure;

FIG. 9D is a schematic cross-sectional structure diagram of a pixel defining layer provided by at least one embodiment of the present disclosure; and FIGS. 10A-10B are schematic diagrams illustrating a formation process of yet another pixel defining layer provided by at least one embodiment of the present disclosure.

DETAILED DESCRIPTION

Figure 1A:
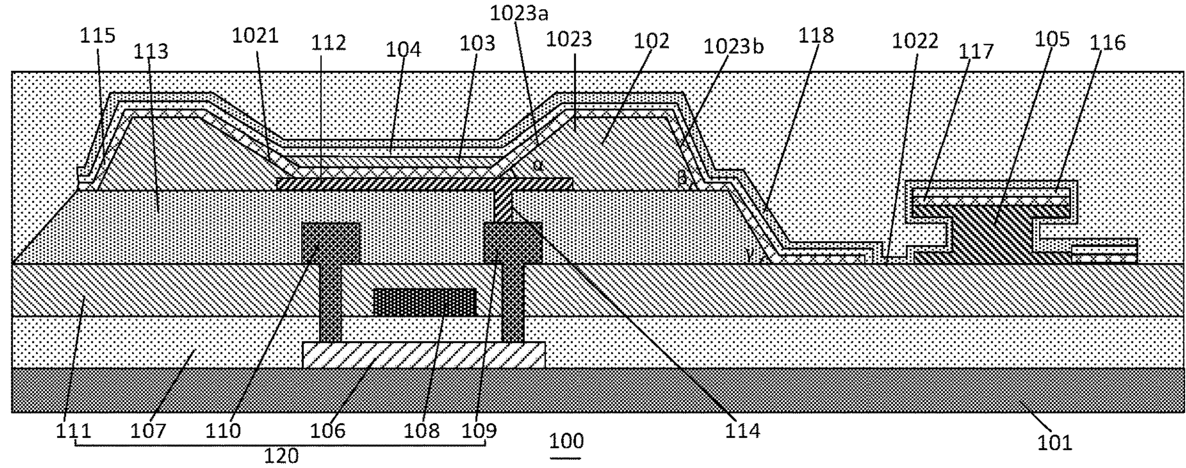
FIG. 1A is a schematic cross-sectional view of an organic light emitting diode display panel provided by at least one embodiment of the present disclosure.

In order to make the purpose, technical scheme and advantages of the embodiment of the disclosure more clear, the technical scheme of the embodiment of the disclosure will be described clearly and completely with the attached drawings. Obviously, the described embodiment is a part of the embodiment of the present disclosure, not the whole embodiment. Based on the described embodiments of the present disclosure, all other embodiments obtained by ordinary people in the field without creative labor belong to the scope of protection of the present disclosure.

Unless otherwise defined, technical terms or scientific terms used in the present disclosure shall have their ordinary meanings as understood by people with ordinary skills in the field to which this disclosure belongs. The terms "first", "second" and the like used in the present disclosure do not indicate any order, quantity or importance, but are only used to distinguish different components. Similar words such as "including" or "containing" mean that the elements or objects appearing before the word cover the elements or objects listed after the word and their equivalents, without excluding other elements or objects. Similar words such as "connected" or "connected" are not limited to physical or mechanical connection, but can include electrical connection, whether direct or indirect. "Up", "Down", "Left" and "Right" are only used to indicate the relative positional relationship. When the absolute position of the described object changes, the relative positional relationship may also change accordingly.

In the related technology of organic light emitting diode (OLED) display panel, the cathode of the top emitting type organic light emitting diode display panel needs to be transparent, and the transmittance and conductivity of the cathode are crucial factors affecting the display quality of the organic light emitting diode display panel.

For example, in the case that the cathode is made of a single layer of indium tin oxide or indium zinc oxide, or a thin-layer metal with high transparency, the resistance of the cathode is relatively large, and it is easy to cause a significant difference between the driving voltage of the central region and the edge region of the organic light emitting diode display panel, that is, a large voltage drop will occur. Moreover, with the increase of the size of the organic light emitting diode display panel, the voltage drop of the cathode is significant, which will lead to the problem of uneven display brightness of the display panel. Therefore, in order to improve the problem of uneven display brightness of organic light emitting diode display panel, the square resistance of cathode can be reduced by adding an auxiliary electrode electrically connected with cathode, so that the IR Drop of the whole organic light emitting diode display panel can be reduced, so as to reduce the power consumption of the organic light emitting diode display panel and further improve the uniformity of display brightness of organic light emitting diode display panel. The square resistance is also called sheet resistance, which is defined as the resistance of a square conductive thin layer in the current direction, that is, the sheet resistance is the resistance value of conductive material per unit thickness and unit area, and its unit is ohm per square. However, the auxiliary electrode needs to occupy a position originally belonging to the display region, which will reduce the resolution of the organic light emitting diode display panel.

The inventor(s) of the present disclosure notices that a slope angle of a side of the pixel defining layer away from a light emitting layer can be increased by adjusting a slope angle of the pixel defining layer, so as to improve the resolution of the organic light emitting diode display panel. However, upon the slope angle of the pixel defining layer being increased, there will be a phenomenon of color shift during the light mixing process, that is, there is a risk of uneven light mixing, which will reduce the display quality of the organic light emitting diode display panel. In addition, if the slope angle is too large, the coverage of the cathode will be poor, and as the temperature of the organic light emitting diode display panel increases during use, the cathode will expand thermally, which will lead to the increase of the resistance of the cathode at the position of the pixel defining layer with a large slope angle, and the light emitting voltage of the pixel will increase, which will eventually lead to the attenuation of the display brightness. Therefore, based on the above reasons, it can be considered that the slope angle of the pixel defining layer adjacent to the light emitting layer is set to be smaller than the slope angle of the pixel defining layer away from the light emitting layer, so as to solve the problem of resolution reduction and the problem of color shift that is easy to occur in the light mixing process, which are caused by setting the auxiliary electrode.

At least one embodiment of the present disclosure provides an organic light emitting diode display panel, which includes a base substrate, a pixel defining layer arranged on the base substrate, and the pixel defining layer includes a first opening, a second opening and a pixel defining structure between the first opening and the second opening, the first opening is provided with a light emitting layer and a first electrode which are stacked, and the second opening is provided with no light emitting layer, a first lateral edge of the pixel defining structure adjacent to the first opening forms a first included angle with a plane parallel to a main surface of the base substrate, and a second lateral edge of the pixel defining structure adjacent to the second opening forms a second included angle with a plane parallel to the main surface of the base substrate, and the first included angle is smaller than the second included angle. The organic light emitting diode display panel makes the first included angle between the first lateral edge of the pixel defining structure adjacent to the first opening and the plane parallel to the main surface of the base substrate smaller than the second included angle between the second lateral edge of the pixel defining structure adjacent to the second opening and the plane parallel to the main surface of the base substrate, so as to solve the problems of resolution reduction and color shift that easily occurs in the light mixing process, which are caused by the arrangement of auxiliary electrodes.

For example, FIG. 1A is a schematic cross-sectional structure diagram of an organic light emitting diode display panel provided by at least one embodiment of the present disclosure. As illustrated by FIG. 1A, the organic light emitting diode display panel 100 includes: a base substrate 101, a pixel defining layer 102 arranged on the base substrate 101, the pixel defining layer 102 includes a first opening 1021, a second opening 1022, and a pixel defining structure 1023 between the first opening 1021 and the second opening 1022, the first opening 1021 is provided with a light emitting layer 103 and a first electrode 104 which are stacked, the second opening 1022 is provided with an auxiliary electrode 105 which is electrically connected with the first electrode 104, and the second opening 1022 is not provided with the light emitting layer. A first lateral edge 1023*a* of the pixel defining structure 1023 adjacent to the first opening 1021 forms a first included angle α with a plane parallel to the main surface of the base substrate 101, and a second lateral edge 1023*b* of the pixel defining structure 1023 adjacent to the second opening 1022 forms a second included angle β with a plane parallel to the main surface of the base substrate 101, and the first included angle α is smaller than the second included angle β. By setting the first included angle α between the first lateral edge 1023*a* of the pixel defining structure 1023 adjacent to the first opening 1021 and the plane parallel to the main surface of the base substrate 101 to be smaller than the second included angle β between the second lateral edge 1023*b* of the pixel defining structure 1023 adjacent to the second opening 1022 and the plane parallel to the main surface of the base substrate 101, the organic light emitting diode display panel 100 can solve the problem of resolution reduction and color shift that easily occurs in the light mixing process, which are caused by the arrangement of the auxiliary electrode 105.

It should be noted that the pixel defining structure 1023 includes a bottom edge close to the base substrate 101, a top edge away from the base substrate 101, and a lateral edge between the top edge and the bottom edge, that is, the lateral edge is sandwiched between the bottom edge and the top edge, and the lateral edge includes the first lateral edge 1023*a* and the second lateral edge 1023*b* which are arranged oppositely.

For example, in the general structure of an organic light emitting diode display panel, the angles between the two opposite lateral edges of the pixel defining structure and the plane parallel to the main surface of the base substrate are equal, and the magnitude of the angles are roughly equal to the first included angle, that is, the angles between the two opposite lateral edges of the pixel defining structure and the plane parallel to the main surface of the base substrate are both small, but this arrangement will reduce the resolution of the organic light emitting diode display panel.

For example, as illustrated by FIG. 1A, the risk of color shift can be reduced by keeping the first included angle α between the first lateral edge 1023*a* of the pixel defining structure 1023 adjacent to the first opening 1021 and the plane parallel to the main surface of the base substrate 101 small. The lateral edge of the pixel defining structure 1023 adjacent to the second opening 1022 can be steep by increasing the second included angle β between the second lateral edge 1023*b* of the pixel defining structure 1023 adjacent to the second opening 1022 and the plane parallel to the main surface of the base substrate 101, thereby reducing the space occupied by the pixel defining structure 1023 and improving the resolution of the organic light emitting diode display panel.

For example, in one example, the first electrode 104 is a cathode, the first electrode 104 extends from the first opening 1021 to the second opening 1022, and the first electrode 104 is spaced apart from the auxiliary electrode 105 in the second opening 1022, that is, the first electrode 104 is disconnected in the second opening. Upon the first electrode 104 being formed, the thin film of the first electrode 104 may be formed as a whole layer, and the material of the first electrode 104 is a conductive metal material, and the thickness of the conductive metal material is very thin, which easily leads to the fracture of the finally formed first electrode 104. For example, in the second opening 1022, due to the high height of the auxiliary electrode 105, the first electrode 104 is broken at a position close to the auxiliary electrode 105 so that the first electrode 104 and the auxiliary electrode 105 are separated in the middle of the second opening 1022.

For example, as illustrated by FIG. 1A, a part of the first electrode 104 is located in the first opening 1021, and another part of the first electrode 104 is located in the second opening 1022, and at least one side of the first electrode 104 located in the second opening 1022 away from the base substrate 101 is provided with a metal oxide conductive layer 118, which extends from the first electrode 104 to at least cover a lateral surface of the auxiliary electrode 105, so that the first electrode 104 and the auxiliary electrode 105 are electrically connected through the metal oxide conductive layer 118, and the auxiliary electrode 105 is electrically connected with the first electrode 104, thereby reducing the resistance of the first electrode 104.

For example, as illustrated by FIG. 1A, the first electrode 104 is at a side of the light emitting layer 103 away from the base substrate 101, and a metal oxide conductive layer 118 is provided at a side of the first electrode 104 away from the base substrate 101 in the first opening 1021 and the second opening 1022, and the metal oxide conductive layer 118 extends from the first opening 1021 to the second opening 1022 and covers the lateral surface of the auxiliary electrode 105. Although the metal oxide conductive layer 118 is not in direct contact with the surface of the auxiliary electrode 105 away from the base substrate 101, the metal oxide conductive layer 118 covers the surface of the auxiliary electrode 105 away from the base substrate 101. That is, the side of the first electrode 104 located in the first opening 1021 away from the base substrate 101 is also provided with the metal oxide conductive layer 118, which is connected in parallel with the first electrode 104 to further reduce the resistance of the first electrode 104, so as to reduce the voltage drop of the whole organic light emitting diode display panel.

For example, as illustrated by FIG. 1A, the metal oxide conductive layer 118 has good ductility, and it is not easy to break even at the position of the auxiliary electrode 105 with high height. The metal oxide conductive layer 118 is arranged as a whole layer, extending from the first opening 1021 to the second opening 1022, and it also covers the lateral surface and the upper surface of the auxiliary electrode 105.

For example, the material of the metal oxide conductive layer 118 includes at least one of indium zinc oxide and indium tin oxide. Of course, the embodiment of the present disclosure is not limited thereto, as long as the material of the metal oxide conductive layer meets the requirements of good conductivity, high transparency and good ductility.

For example, as illustrated by FIG. 1A, a second electrode 112 is arranged at a side of the light emitting layer 103 close to the base substrate 101, and a thin film transistor 120 is arranged at a side of the second electrode 112 close to the base substrate 101, and a planarization layer 113 is disposed between the second electrode 112 and the thin film transistor 120. The second electrode 112 is connected with a first source-drain electrode 109 of the thin film transistor 120 through a first via hole structure 114 in the planarization layer 113.

For example, as illustrated by FIG. 1A, the case illustrated by FIG. 1A takes a top gate type thin film transistor as the thin film transistor as an example, the thin film transistor 120 includes an active layer 106, a gate insulating layer 107, a gate electrode 108, an interlayer insulating layer 111, a first source-drain electrode 109 and a second source-drain electrode 110, and the planarization layer 113 is arranged at a side of the first source-drain electrode 109 and the second source-drain electrode 110 away from the base substrate 101. The second electrode 112 is arranged at a side of the planarization layer 113 away from the base substrate 101, and is electrically connected with the first source-drain electrode 109 through the first via hole structure 114 penetrating the planarization layer 113.

For example, the material of the gate electrode 108 can be a combination of copper and other metals, such as copper/molybdenum (Cu/Mo), copper/titanium (Cu/Ti), copper/molybdenum titanium alloy (Cu/MoTi), copper/molybdenum tungsten alloy (Cu/MoW), copper/molybdenum niobium alloy (Cu/MoNb), etc. The material of the gate metal layer can also be a chromium-based metal or a combination of chromium and other metals, for example, chromium/molybdenum (Cr/Mo), chromium/titanium (Cr/Ti), chromium/molybdenum titanium alloy (Cr/MoTi) and the like.

For example, the gate insulating layer 107 and the interlayer insulating layer 111 can play a role of protection and insulation. Materials of the gate insulating layer 107 and the interlayer insulating layer 111 include silicon nitride (SiNx), silicon oxide (SiOx), aluminum oxide ($Al_2O_3$), aluminum nitride (AlN), acrylic resin or other suitable materials.

For example, the material of the active layer 106 is indium gallium zinc oxide (IGZO), indium tin oxide (ITO), indium zinc oxide (IZO), indium gallium oxide (IGO), gallium zinc oxide (GZO), carbon nanotubes, etc. The material of the transparent conductive film can also be made of zinc oxide (ZnO), indium oxide ($In_2O_3$), zinc aluminum oxide (AZO), etc. The oxide semiconductor layer can be deposited by magnetron sputtering and its thickness can be 30-50 nm.

For example, the materials of the first source-drain electrode 109 and the second source-drain electrode 110 are copper-based metals. Copper metal has the characteristics of low resistivity and good conductivity, so it can improve the signal transmission rate of the first source-drain electrode and the second source-drain electrode and improve the display quality.

For example, the copper-based metal is copper (Cu) and a stable copper-based metal alloy such as: copper-zinc alloy (CuZn), copper-nickel alloy (CuNi) or copper-zinc-nickel alloy (CuZnNi).

For example, in one example, the second electrode 112 may be an anode and the corresponding first electrode 104 may be a cathode.

For example, in one example, on the basis of ensuring that the first included angle $\alpha$ is smaller than the second included angle $\beta$, the value range of the first included angle $\alpha$ can be 20°-40°, and the value range of the second included angle $\beta$ can be 65°-90°. For example, the value of the first included angle can be 20°, 25°, 30°, 35°, or 40°, the value of the second included angle $\beta$ can be 65°, 70°, 75°, 85° or 90°, which is not limited by the embodiment of the present disclosure.

For example, as illustrated by FIG. 1A, a lateral edge of the planarization layer 113 adjacent to the second opening 1022 forms a third included angle $\gamma$ with the plane parallel to the main surface of the base substrate 101, and the value range of the third included angle $\gamma$ can be 65°-90°, and the third included angle $\gamma$ is equal to the second included angle $\beta$. The planarization layer 113 is not completely transparent, and at least some light rays will be blocked, so the above design will not reduce the resolution of the display panel caused by the block of the planarization layer 113. In addition, the pixel defining structure 1023 is retracted to the side close to the first opening 1021 relative to the planarization layer 113, so that a step is formed at the position where the pixel defining structure 1023 and the planarization layer 113 meet, so that the first electrode 104 is not easy to break at the position where the pixel defining structure 1023 and the planarization layer 113 meet, thereby reducing the risk of disconnection.

It should be noted that the embodiment of the present disclosure is not limited thereto, and the third included angle $\gamma$ may be greater than the second included angle $\beta$.

For example, as illustrated by FIG. 1A, the distance between a part of an orthographic projection of a lateral edge of the planarization layer 113 adjacent to the second opening 1022 on the base substrate 101 farthest from the first opening 1021 and a part of an orthographic projection of the second lateral edge 1023*b* of the pixel defining structure 1023 on the base substrate 101 is greater than 0, that is, the pixel defining structure 1023 is retracted to the side close to the first opening 1021 relative to the planarization layer 113, so that a step is formed at the position where the pixel defining structure 1023 and the planarization layer 113 meet.

It should be noted that the main surface of the base substrate 101 refers to a surface of the base substrate 101 provided with structures such as the light emitting layer 103, the gate electrode 108, the second source-drain electrode 110, the first source-drain electrode 109, the first electrode 104 and the second electrode 112.

For example, in another example, the thickness of the planarization layer 113 in the direction perpendicular to the base substrate 101 is greater than that of the pixel defining layer 102 in the direction perpendicular to the base substrate 101, and there is a third included angle γ between the lateral edge of the planarization layer 113 adjacent to the second opening 1022 and the plane parallel to the main surface of the base substrate 101, which can be greater than the second included angle β. This design can prevent the first electrode 104 from easily breaking at the junction of the pixel defining structure 1023 and the planarization layer 113, thereby reducing the risk of a circuit break.

For example, as illustrated by FIG. 1A, the organic light emitting diode display panel 100 further includes a first organic functional layer 115, which extends from the first opening 1021 to the second opening 1022 and is fractured in the second opening 1022. The first organic functional layer 115 may be a single-layer structure or a multi-layer laminated structure. What is shown in FIG. 1A is that the first organic functional layer 115 is arranged at a side of the light emitting layer 103 close to the base substrate 101. The first organic functional layer 115 may be one of the hole injection layer and the hole transport layer, or it may be a laminated structure of the hole injection layer and the hole transport layer, and the hole injection layer is at a side of the hole transport layer close to the base substrate 101.

Figure 2:
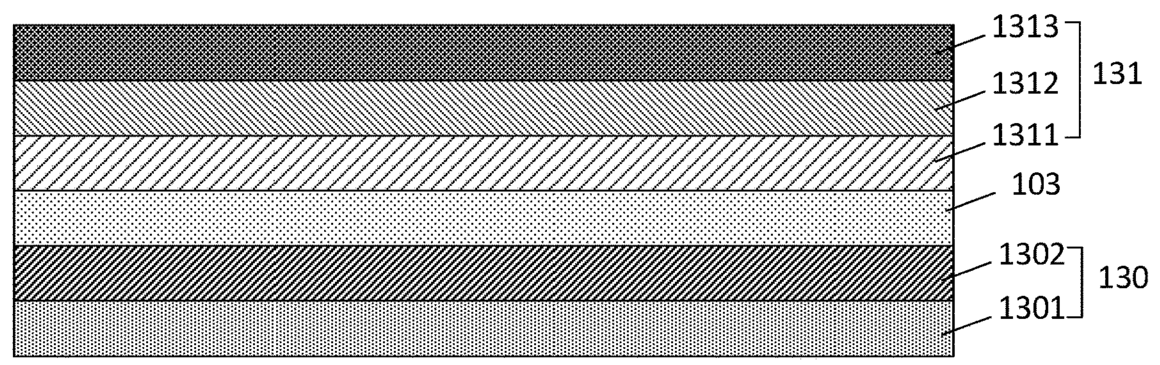
FIG. 2 is a schematic cross-sectional view of a first organic functional layer and a light emitting layer provided by at least one embodiment of the present disclosure.

For example, although only the case that the first organic functional layer 115 is arranged at a side of the light emitting layer 103 close to the base substrate 101 is shown in FIG. 1A, in other examples, the first organic functional layer 115 may include a first part 130 and a second part 131 that are spaced apart from and stacked with the light emitting layer 103. For example, FIG. 2 is a schematic cross-sectional structure diagram of a first organic functional layer and a light emitting layer provided by at least one embodiment of the present disclosure. As illustrated by FIG. 2, a first part 130 of the first organic functional layer 115 is arranged at a side of the light emitting layer 103 close to the base substrate 101, and a second part 131 of the first organic functional layer 115 is arranged at a side of the light emitting layer 103 away from the base substrate 101. The first part 130 is a laminated structure of a hole injection layer 1301 and a hole transport layer 1302. Of course, the embodiment of the present disclosure is not limited thereto, and the first part 130 may also be one of the hole injection layer 1301 and the hole transport layer 1302. The second part 131 is a laminated structure of a hole blocking layer 1311, an electron transport layer 1312 and an electron injection layer 1313, and the hole blocking layer 1311 is in direct contact with the light emitting layer 103, and the electron injection layer 1313 is at a side of the electron transport layer 1312 away from the base substrate 101.

For example, although FIG. 1A only shows the case that the first organic functional layer 115 is at a side of the light emitting layer 103 close to the base substrate 101, in the case that the first organic functional layer 115 is a laminated structure as illustrated by FIG. 2, the positional relationship between the first organic functional layer 115 and the light emitting layer 103 may be the structure as illustrated by FIG. 2. Combined with FIG. 1A and FIG. 2, the electron injection layer 1313, the electron transport layer 1312, the light emitting layer 103, the hole transport layer 1302 and the hole injection layer 1301 included by the first organic functional layer 115 are formed as whole layers by evaporation, and the electron injection layer 1313, the electron transport layer 1312, the light emitting layer 103, the hole transport layer 1302 and the hole injection layer 1301 mentioned above are all extend from the first opening 1021 to the second opening 1022, and break in the second opening 1022 so as to be spaced apart from the auxiliary electrode 105 in the plane parallel to the main surface of the base substrate 101.

For example, as illustrated by FIG. 1A, a first sub-electrode 116 is arranged between the auxiliary electrode 105 and the metal oxide conductive layer 118, the first sub-electrode 116 and the first electrode 104 are formed in the same layer in the same process step. A whole layer of first electrode film is formed by magnetron sputtering, a part of the first electrode film extending from the first opening 1021 to the second opening 1022 serves as the first electrode 104, the first electrode film is broken in the second opening 1022, and a part remained on the auxiliary electrode 105 serves as the first sub-electrode 116. The first sub-electrode 116 and the first electrode 104 are respectively electrically connected with the metal oxide conductive layer 118, and the auxiliary electrode 105 is electrically connected with the metal oxide conductive layer 118, and the auxiliary electrode 105 forms a laminated structure with the first sub-electrode 116, and the auxiliary electrode 105 is in direct contact with the first sub-electrode 116. This design further reduces the resistance of the first sub-electrode 116 and the first electrode 104.

For example, as illustrated by FIG. 1A, a second organic functional layer 117 is provided at a side of the auxiliary electrode 105 away from the base substrate 101, and the first organic functional layer 115 and the second organic functional layer 117 are formed in the same layer in the same process step. In a direction perpendicular to the main surface of the base substrate 101, corresponding electron injection layer, electron transport layer, light emitting layer, hole transport layer and hole injection layer remain between the auxiliary electrode 105 and the metal oxide conductive layer 118, which constitute the second organic functional layer 117.

It should be noted that, in the embodiment of the present disclosure, the first sub-electrode 116 and the first electrode 104 are formed in the same layer in the same process step, and "formed in the same layer in the same process step" in the expression that the first organic functional layer 115 and the second organic functional layer 117 are formed in the same layer in the same process step refers to that the same film formation process is adopted to form a film layer of a specific pattern, and then the same mask plate is adopted to pattern the film layer to form a corresponding layer structure by one patterning process. According to different specific patterns, the patterning process can sequentially include multiple exposure, development and etching processes, and the formed specific patterns arranged in the same layer can be continuous or discontinuous, and these specific patterns may also be at different heights or have different thicknesses.

For example, methods of forming the above-mentioned electron injection layer 1313, electron transport layer 1312, light emitting layer 103, hole transport layer 1302 and hole injection layer 1301 include deposition method, lithographic method, inkjet printing method, thermal transfer method and evaporation method. The deposition method includes: adopting a shadow mask to block the vacuum deposition organic material to form the first organic functional layer and the second organic functional layer. The lithography method includes: depositing an organic material, and patterning the organic material with a photoresist after depositing the organic material to form the first organic functional layer and the second organic functional layer. The lithography method can be suitable for forming a high-resolution pattern. The ink-jet printing method can directly pattern the organic film layer. In the ink-jet printing method, a solution containing an organic material is sprayed from the head of an ink-jet printer to form the first organic functional layer and the second organic functional layer, and the operation of the ink-jet printing method is relatively simple. The thermal transfer method can use, for example, laser-induced thermal transfer to form the first organic functional layer and the second organic functional layer. By this method, a high-resolution pattern and a thin film with uniform thickness can be formed, and it can also be produced on a large scale.

For example, in one example, the auxiliary electrode 105 includes a titanium metal layer, an aluminum metal layer and a titanium metal layer which are stacked, that is, the aluminum metal layer is sandwiched between the two titanium metal layers to form an I-shaped structure, so that the stability of the auxiliary electrode 105 can be improved.

For example, an orthographic projection of the aluminum metal layer on the base substrate 101 is within an orthographic projection of the titanium metal layer on the base substrate 101.

For example, in one example, a plurality of first openings 1021 are provided, and the colors of light emitted by the light emitting layers 103 in adjacent first openings 1021 are different. For example, the color of the light emitted by the light emitting layer 103 in one first opening 1021 is red, and the colors of the light emitted by the light emitting layers 103 in two first openings 1021 adjacent to the first opening 1021 are green and blue, respectively, so that the light emitted by the light emitting layers 103 in three adjacent first openings 1021 can be mixed to form white light. For example, the whole structure shown in FIG. 1A can be used as a repeating unit without considering the difference that the colors of light emitted by the light emitting layers 103 in different first openings 1021 are different.

Figure 1B:
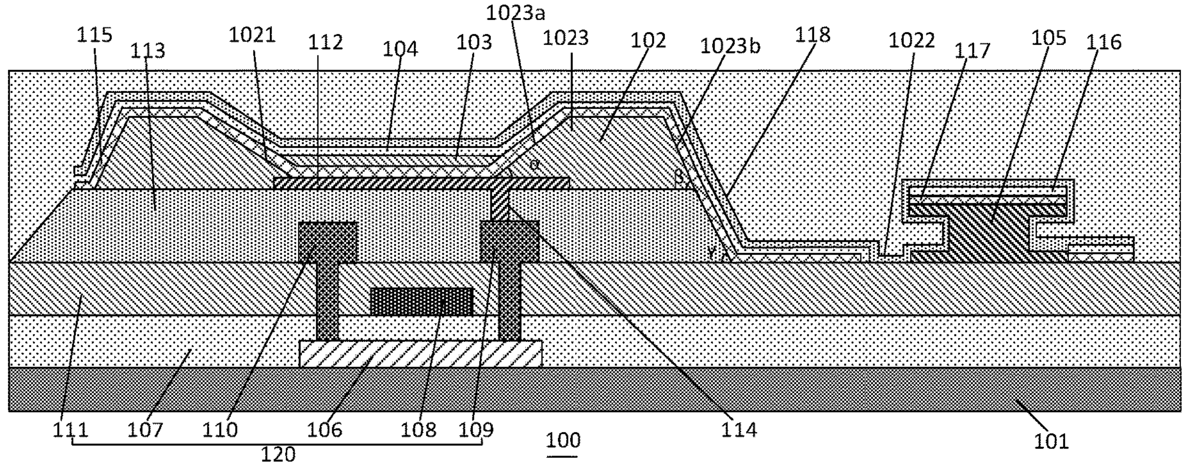
FIG. 1B is a schematic cross-sectional view of another organic light emitting diode display panel provided by at least one embodiment of the present disclosure.

For example, FIG. 1B is a schematic cross-sectional structure diagram of another organic light emitting diode display panel provided by at least one embodiment of the present disclosure. As illustrated by FIG. 1B, the materials of the pixel defining layer 102 and the planarization layer 113 may be the same, for example, they may both be inorganic insulating materials, such as silicon nitride and silicon oxide. The pixel defining layer 102 and the planarization layer 113 can be formed in the same process step, so the pixel defining layer 102 and the planarization layer 113 can share one lateral edge. As illustrated by FIG. 1B, the second lateral edge 1023*b* of the pixel defining structure 1023 is on the same plane as the lateral edge of the planarization layer 113 close to the second opening 1022. This kind of design can reduce the process steps, thus reducing the manufacturing cost.

For example, as illustrated by FIG. 1B, the second lateral edge 1023*b* of the pixel defining structure 1023 adjacent to the second opening 1022 forms a second included angle β with the plane parallel to the main surface of the base substrate 101, and the lateral edge of the planarization layer 113 adjacent to the second opening 1022 forms a third included angle γ with the plane parallel to the main surface of the base substrate 101, the third included angle γ is equal to the second included angle β, and the value ranges of the second included angle β and the third included angle γ can be 65° to 90°.

Figure 1C:
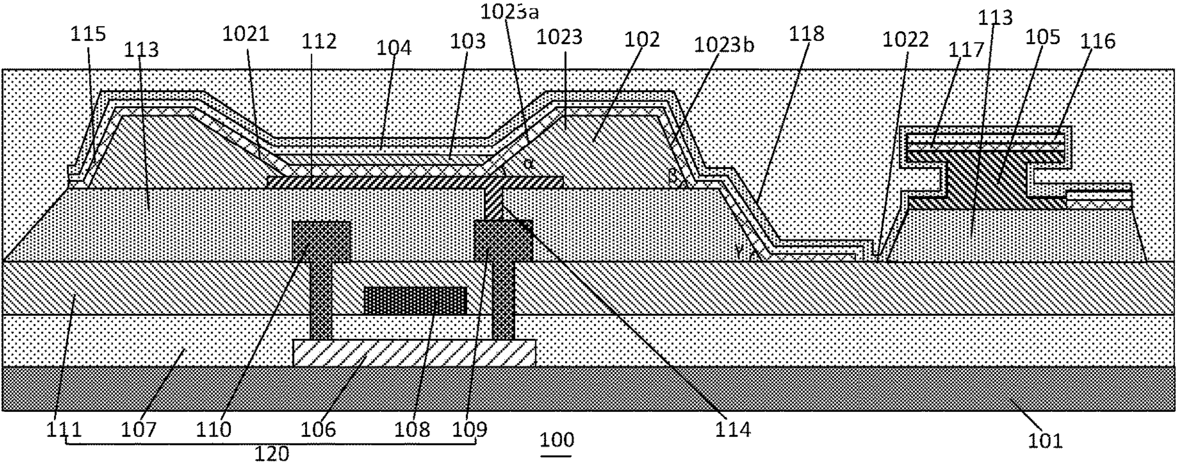
FIG. 1C is a schematic cross-sectional view of yet another organic light emitting diode display panel provided by at least one embodiment of the present disclosure.

For example, FIG. 1C is a schematic cross-sectional structure diagram of another organic light emitting diode display panel provided by at least one embodiment of the present disclosure. As illustrated by FIG. 1C, the planarization layer 113 is arranged in the second opening 1022, and the auxiliary electrode 105 is arranged at a side of the planarization layer 113 away from the base substrate 101. For example, the material of the auxiliary electrode 105 may include a metal oxide conductive layer, a silver conductive layer and a metal oxide conductive layer which are stacked in sequence, for example, a laminated structure of ITO/Ag/ITO.

For example, as illustrated by FIG. 1C, the second lateral edge 1023*b* of the pixel defining structure 1023 adjacent to the second opening 1022 forms the second included angle β with the plane parallel to the main surface of the base substrate 101, and the lateral edge of the planarization layer 113 adjacent to the second opening 1022 forms the third included angle γ with the plane parallel to the main surface of the base substrate 101, the third included angle γ is equal to the second included angle β, or the third included angle γ is greater than the second included angle β.

Figure 1D:
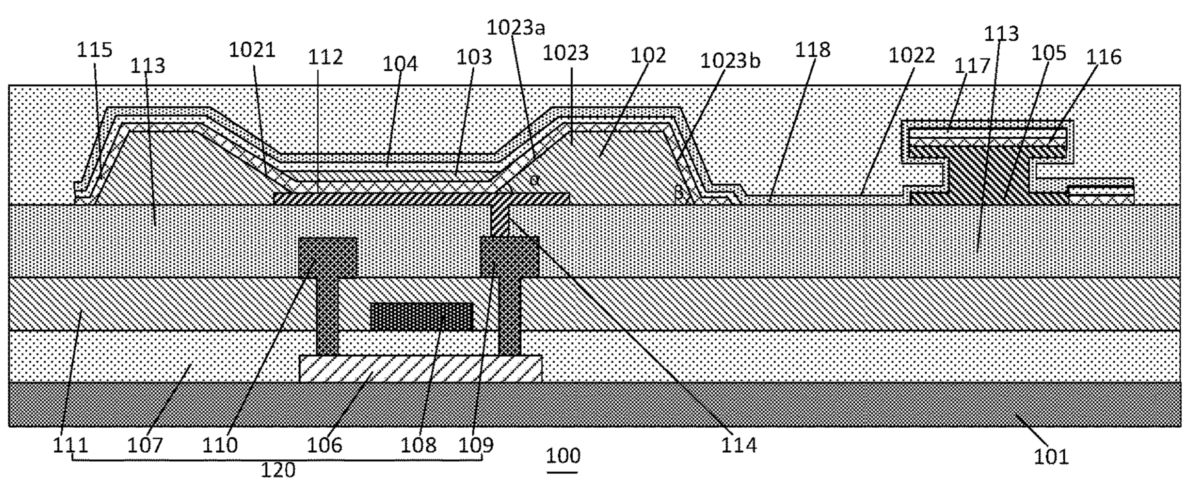
FIG. 1D is a schematic cross-sectional view of yet another organic light emitting diode display panel provided by at least one embodiment of the present disclosure.

For example, FIG. 1D is a schematic cross-sectional structure diagram of another organic light emitting diode display panel provided by at least one embodiment of the present disclosure. As illustrated by FIG. 1D, the planarization layer 113 is formed as a whole layer, and the thickness of the planarization layer 113 is uniform, so it is not needed to perform a patterning process on the planarization layer 113, so as to reduce one process step.

Figure 1E:
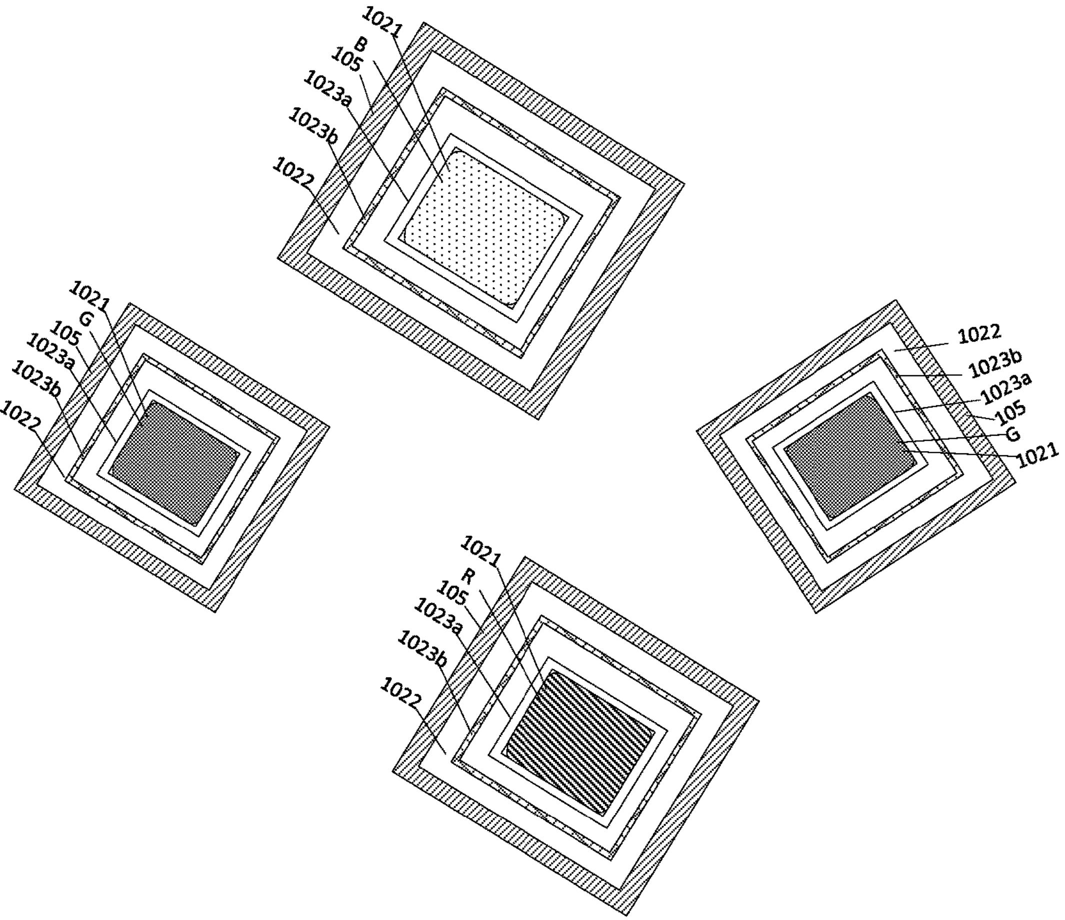
FIG. 1E is a schematic plan view of an organic light emitting diode display panel provided by at least one embodiment of the present disclosure.

For example, FIG. 1E is a schematic plan view of an organic light emitting diode display panel provided by at least one embodiment of the present disclosure, what is shown by FIG. 1E is an arrangement sequence of a red sub-pixel R, a green sub-pixel G and a blue sub-pixel B. A first opening 1021, a second opening 1022, a first lateral edge 1023*a* of the pixel defining structure 1023 adjacent to the first opening 1022, and a second lateral edge 1023*b* of the pixel defining structure 1023 adjacent to the second opening 1022 are shown around each sub-pixel. For other structures of the organic light emitting diode display panel, please refer to the related description above. The repeated portions are omitted herein.

For example, FIG. 1E shows two green sub-pixels G, one red sub-pixel R and one blue sub-pixel B, and the two green sub-pixels G are symmetrical with respect to a straight line connecting the center of the red sub-pixel R and the center of the blue sub-pixel B.

For example, in one example, the second opening 1022 is a transparent display region, and no pixel defining layer is provided in the second opening 1022. For details, please refer to the related description of FIG. 3 below.

For example, in another example, the second opening 1022 can also be provided with a fingerprint sensor, which can be seen in the following description of FIG. 5.

At least one embodiment of the present disclosure also provides a display device including the organic light emitting diode display panel in any of the above embodiments. The display device can include the small and medium-sized electronic devices including a tablet computer, a smart phone, a head-mounted display, a vehicle navigation unit, a camera, a central information display (CID) provided in vehicle, a watch-type electronic device or other wearable devices, a personal digital assistant (PDA), a portable multimedia player (PMP) and a game machine, and medium and large-sized electronic devices including a television, an external billboard, a monitor, a household appliance including a display screen, a personal computer and a laptop computer, and transparent display devices and organic photoelectric sensor devices with a display function. The electronic device as described above may represent a simple example for applying a display device, and therefore, a person skilled in the art can recognize that the display panel can also be applied to any other electronic device with a display function without departing from the spirit and scope of the present disclosure.

Figure 3:
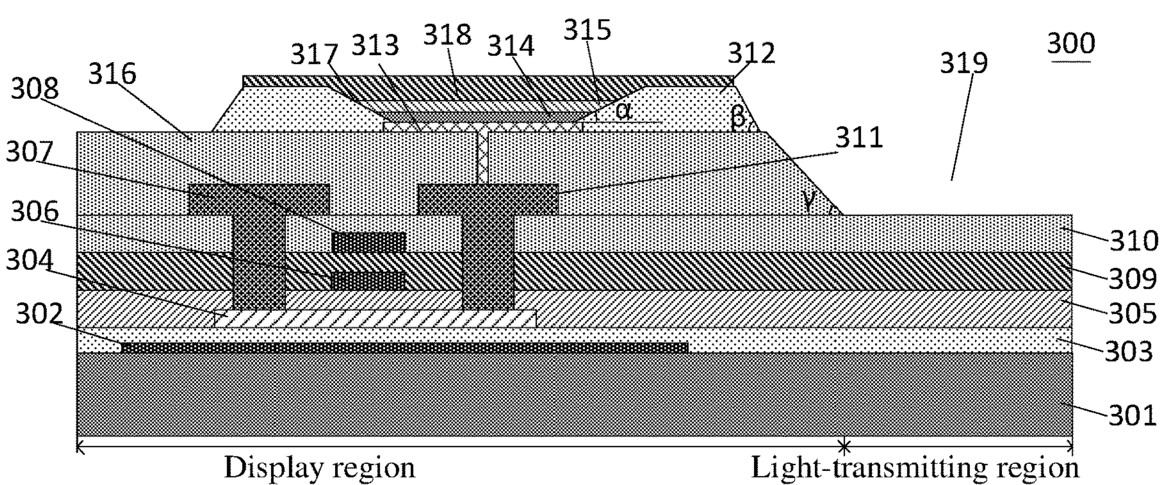
FIG. 3 is a schematic cross-sectional view of a transparent display device provided by at least one embodiment of the present disclosure.

For example, FIG. 3 is a schematic cross-sectional structure of a transparent display device provided by at least one embodiment of the present disclosure. As illustrated by FIG. 3, the transparent display device 300 includes a base substrate 301, a light shielding layer 302, a buffer layer 303, an active layer 304, a first gate insulating layer 305, a first gate electrode 306, a second gate insulating layer 309, a second gate electrode 308 and an interlayer insulating layer 310, which are sequentially arranged on the base substrate 301. The first source-drain electrode 307 and the second source-drain electrode 311 are arranged at a side of the interlayer insulating layer 310 away from the base substrate 301, and the first source-drain electrode 307 and the second source-drain electrode 311 are oppositely arranged, and a planarization layer 316 and a pixel defining structure 312 are sequentially arranged at a side of the first source-drain electrode 307 and the second source-drain electrode 311 away from the base substrate 301. A first opening 317 and a second opening 319 are provided between adjacent pixel defining structures 312. The first opening 317 and the second opening 319 are alternately arranged. In the first opening 317, a second electrode 313, an organic functional layer 314, a light emitting layer 315 and a first electrode 318 are stacked. The transparent display device 300 includes a display region and a light-transmitting region. The first opening 317 corresponds to the display region, and the second opening 319 corresponds to the light-transmitting region, that is, a transparent display region. No pixel defining layer is provided in the second opening 319. A first lateral edge of the pixel defining structure 312 adjacent to the first opening 317 forms a first included angle $\alpha$ with a plane parallel to a main surface of the base substrate 301, and a second lateral edge of the pixel defining structure 312 adjacent to the second opening 319 forms a second included angle $\beta$ with the plane parallel to the main surface of the base substrate 301, and the first included angle $\alpha$ is smaller than the second included angle $\beta$. The transparent display device 300 makes the first included angle $\alpha$ between the first lateral edge of the pixel defining structure 312 adjacent to the first opening 317 and the plane parallel to the main surface of the base substrate 301 smaller than the second included angle $\beta$ between the second lateral edge of the pixel defining structure 312 adjacent to the second opening 319 and the plane parallel to the main surface of the base substrate 301, so as to increase the area of the light-transmitting region without reducing the area of the display region.

For example, in one example, on the basis of ensuring that the first included angle $\alpha$ is smaller than the second included angle $\beta$, the value range of the first included angle $\alpha$ can be 20° to 40°, and the value range of the second included angle $\beta$ can be 65° to 90°. For example, the value of the first included angle $\alpha$ can be 20°, 25°, 30°, 35°, or 40°. The value of the second included angle $\beta$ can be 65°, 70°, 75°, 85° or 90°, which is not limited by the embodiment of the present disclosure.

For example, as illustrated by FIG. 3, a lateral edge of the planarization layer 316 adjacent to the second opening 319 forms a third included angle $\gamma$ with the plane parallel to the main surface of the base substrate 301, and the value range of the third included angle $\gamma$ can be 65° to 90°, and the third included angle $\gamma$ is equal to the second included angle $\beta$, so that a space ratio of the light-transmitting region will not be reduced due to the planarization layer 316. In addition, the pixel defining structure 312 is retracted to a side close to the first opening 317 relative to the planarization layer 316, so that a step is formed at the position where the pixel defining structure 312 and the planarization layer 316 meet, so that the first electrode 318 is not easy to break at the position where the pixel defining structure 312 and the planarization layer 316 meet, thereby reducing the risk of disconnection.

It should be noted that the transparent display device requires that the space ratio of the display region be as small as possible and the space ratio of the non-display region be as large as possible. The transmittance of the planarizing layer 316 and the pixel defining structure 312 is about 80%. By setting the planarizing layer 316 and the pixel defining structure 312 in the non-display region (light-transmitting region) to have a large angle, the space ratio of the light-transmitting region can be obviously increased, so that the light transmittance can be improved. By comparison, it is found that upon the area of non-display region (light-transmitting region) being increased from 32.57% to 41.47%, the light transmittance can be increased by 27%. Although the shielding of the light shielding layer 302 is the key factor to determine whether the light passes through, the pixel defining structure 312 will also shield the light to a certain extent, thus reducing the area of the light-transmitting region. By increasing the second included angle $\beta$ between the second lateral edge of the pixel defining structure 312 adjacent to the second opening 319 and the plane parallel to the main surface of the base substrate 301, the area of the light-transmitting region can be increased, so as to increase the space ratio of the light-transmitting region, so that the overall transmittance of the transparent display device 300 is increased, and the first included angle $\alpha$ between the first lateral edge of the pixel defining structure 312 adjacent to the first opening 317 and the plane parallel to the main surface of the base substrate 301 is kept small, so that the risk of color shift in the display region can be reduced, and the quality of the transparent display device can be improved.

Figure 4:
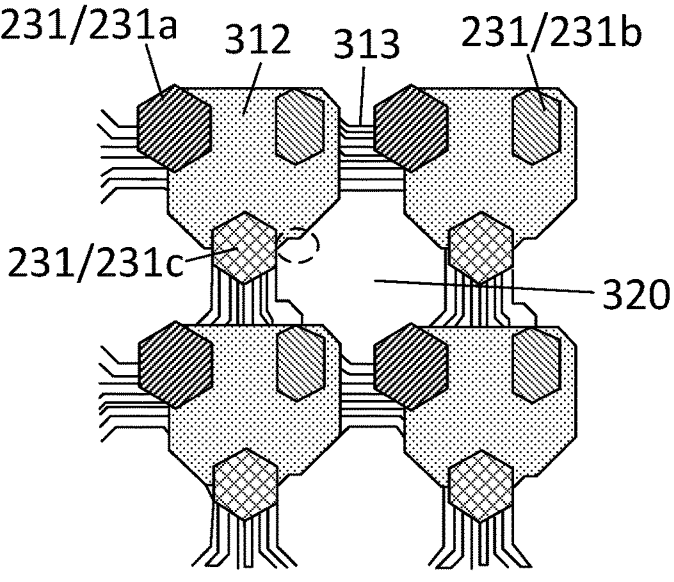
FIG. 4 is a schematic plan view of a pixel defining structure, a light emitting element and wires of a transparent display device provided by at least one embodiment of the present disclosure.

For example, FIG. 4 is a schematic plan view of a pixel defining structure, a light emitting element and wires of a transparent display device provided by at least one embodiment of the present disclosure. As illustrated by FIG. 4, a region surrounded by the four pixel defining structures 312 and the conductive line 313 is a light-transmitting region 320, and a region where the light emitting layer is located is a display region. For example, each pixel defining structure 312 corresponds to three light emitting units 231, which include a first color light emitting unit 231*a*, a second color light emitting unit 231*b* and a third color light emitting unit 231*c*. For example, the first color light emitting unit 231*a*, the second color light emitting unit 231*b* and the third color light emitting unit 231*c* may be a red light emitting unit, a green light emitting unit and a blue light emitting unit, respectively. For example, a position marked by an oval dotted line frame in FIG. 4 is position corresponding to the second included angle $\beta$, a part of the pixel defining structure 312 at the lower right corner of the pixel defining structure 312 at the upper left side of the dotted line frame is retracted in a direction away from the center of the light-transmitting region, so that the area of the light-transmitting region is increased. Similarly, the pixel defining structures 312 at the upper right corner, the lower left corner and the lower right corner all have the design of retracting in the direction away from the center of the corresponding light-transmitting regions, so that the areas of the corresponding light-transmitting regions are all increased. Therefore, the space ratio of the light-transmitting region of the transparent display device is improved as a whole.

Figure 5:
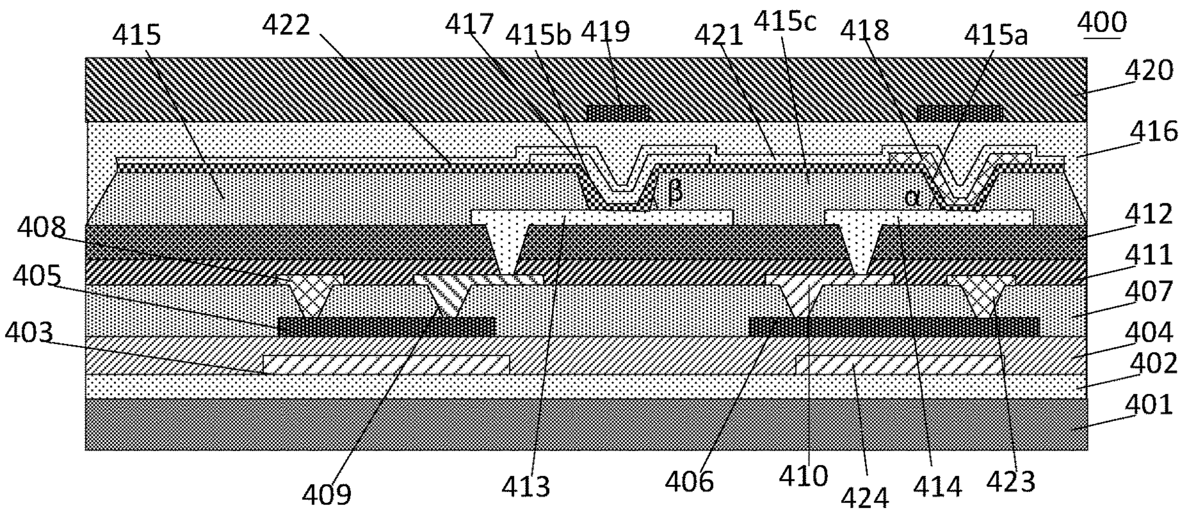
FIG. 5 is a schematic cross-sectional view of an organic photoelectric sensing device with display function provided by at least one embodiment of the present disclosure.

For example, FIG. 5 is a schematic cross-sectional view of an organic photoelectric sensing device with display function provided by at least one embodiment of the present disclosure. As illustrated by FIG. 5, a buffer layer 402 is arranged on a base substrate 401, and a first gate electrode 403, a first gate insulating layer 404, a first active layer 405, and a first source-drain electrode 408 and a second source-drain electrode 409 arranged in the same layer are sequentially arranged on the buffer layer 402. On the buffer layer 402, a second gate electrode 424 arranged in the same layer as the first gate electrode 403 is further provided. On the first gate insulating layer 404, a second active layer 406 arranged in the same layer as the first active layer 405 is further provided. At a side of the second active layer 406 away from the base substrate 401, a second insulating layer 407 is further provided, the second insulating layer 407 is also arranged between the first active layer 405 and the first source-drain electrode 408/second source-drain electrode 409. A third source-drain electrode 410 and a fourth source-drain electrode 423, which are arranged in the same layer as the first source-drain electrode 408/second source-drain electrode 409, are further provided at a side of the second insulating layer 407 away from the base substrate 401, and a passivation layer 411 is further provided at a side of the first source-drain electrode 408/second source-drain electrode 409 and the third source-drain electrode 410/fourth source-drain electrode 423 away from the base substrate 401. A planarization layer 412 is further provided at a side of the passivation layer 411 away from the base substrate 401, and a first electrode 413 and a third electrode 414 arranged in the same layer are provided at a side of the planarization layer 412 away from the base substrate 401. The first electrode 413 is electrically connected to the second source-drain electrode 409 through a second via hole structure penetrating the passivation layer 411 and the planarization layer 412, and the third electrode 414 is electrically connected to the third source-drain electrode 410 through a third via hole structure penetrating the passivation layer 411 and the planarization layer 412. A pixel defining layer 415 is arranged on a side of the first electrode 413 and the third electrode 414 away from the base substrate 401, and the pixel defining layer 415 includes a first opening 415*a*, a second opening 415*b*, and a pixel defining structure 415*c* between the first opening 415*a* and the second opening 415*b*. The first opening 415*a* is provided with an organic functional layer 422, a light emitting layer 418 and a first electrode 421 which are stacked, and the second opening 415*b* is provided with the organic functional layer 422, a photosensitive layer 417 and a first electrode 421, which constitute a fingerprint recognition sensor. The organic functional layer 422 and the first electrode 421 may be integrally formed. An insulating layer 416 is provided at a side of the first electrode 421 away from the base substrate 401, a light-through hole 419 is provided at a side of the insulating layer 416 away from the base substrate 401, and a cover plate 420 is provided at a side of the light-through hole 419 away from the base substrate 401, in which a touch electrode is provided.

For example, as illustrated by FIG. 5, a first lateral edge of the pixel defining structure 415*c* adjacent to the first opening 415*a* forms a first included angle α with a plane parallel to the main surface of the base substrate 401, and a second lateral edge of the pixel defining structure 415*c* adjacent to the second opening 415*b* forms a second included angle β with the plane parallel to the main surface of the base substrate 401, and the first included angle α is smaller than the second included angle β. The organic photoelectric sensing device 400 with display function makes the first included angle α between the first lateral edge of the pixel defining structure 415*c* adjacent to the first opening 415*a* and the plane parallel to the main surface of the base substrate 401 smaller than the second included angle β between the second lateral edge of the pixel defining structure 415*c* adjacent to the second opening 415*b* and the plane parallel to the main surface of the base substrate 401, so as to increase the area of the sensor device to increase the amount of light signal on the basis of not reducing the area of the display region. Further, the first included angle α between the first lateral edge of the pixel defining structure 415*c* adjacent to the first opening 415*a* and the plane parallel to the main surface of the base substrate 401 can be kept small, so that the risk of color shift during the light mixing process can be reduced.

For example, in the general structure of an organic photoelectric sensing device with display function, the angles between the two opposite lateral edges of the pixel defining structure and the plane parallel to the main surface of the base substrate are equal, and the magnitude of the angles is roughly equal to the first included angle, that is, the angles between the two opposite lateral edges of the pixel defining structure and the plane parallel to the main surface of the base substrate are both small, which will increase the area of the sensing device to increase the amount of light signal.

Figure 6:
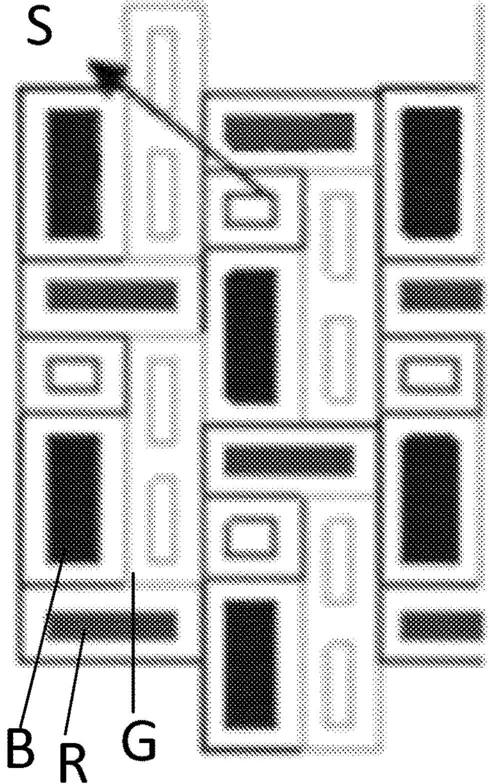
FIG. 6 is a schematic plan view of the organic photoelectric sensing device with display function shown in FIG. 5.

For example, FIG. 6 is a schematic plan view of the organic photoelectric sensing device with display function shown in FIG. 5. As illustrated by FIG. 6, the case that one pixel unit includes one red sub-pixel (R), one blue sub-pixel (B) and two green sub-pixels (G) is taken as an example, that is, an GGRB pixel arrangement is taken as an example, and each pixel unit is provided with a photosensitive element S including a photosensitive layer. Of course, the embodiments of the present disclosure are not limited thereto, and the other arrangements of sub-pixels are also be adapted.

For example, in one example, compared with a conventional display device without the light sensing element S, the aperture ratio of the organic photoelectric sensing device with display function can be reduced from 33.9% to 22.97% by setting the light sensing element S with the size of 180 μm*2 on the premise of the same display resolution of 440 PPI. Setting the photosensitive element S will reduce the aperture ratio of the whole organic photoelectric sensing device with display function. The second included angle β between the second lateral edge of the pixel defining structure 415*c* adjacent to the second opening 415*b* and the plane parallel to the main surface of the base substrate 401 is increased, so that the aperture area occupied by the photosensitive element S can be reduced, and the aperture ratio can be compensated to some extent.

Figure 7:
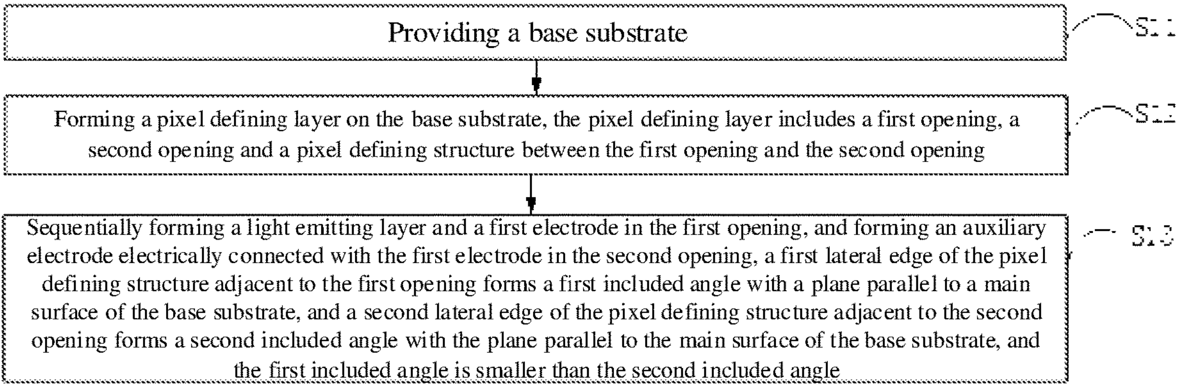
FIG. 7 is a flowchart of a manufacturing method of an organic light emitting diode display panel provided by at least one embodiment of the present disclosure.

At least one embodiment of the present disclosure also provides a manufacturing method of an organic light emitting diode display panel. For example, FIG. 7 is a flowchart of a manufacturing method of an organic light emitting diode display panel provided by at least one embodiment of the present disclosure, and as illustrated by FIG. 7, the manufacturing method includes the following steps.

Step S11: providing a base substrate.

Step S12: forming a pixel defining layer on the base substrate, the pixel defining layer includes a first opening, a second opening and a pixel defining structure between the first opening and the second opening.

Step S13: sequentially forming a light emitting layer and a first electrode in the first opening, and forming an auxiliary electrode electrically connected with the first electrode in the second opening, a first lateral edge of the pixel defining structure adjacent to the first opening forms a first included angle with a plane parallel to a main surface of the base substrate, and a second lateral edge of the pixel defining structure adjacent to the second opening forms a second included angle with the plane parallel to the main surface of the base substrate, and the first included angle is smaller than the second included angle.

For example, the light emitting layer is not provided in the second opening.

For example, in one example, a photolithography process can be used to adopt different exposure amounts for different positions of the pixel defining layer to realize the formation of the first opening and the second opening in the pixel defining layer and make the pixel defining structure have different angles.

Figure 8A:
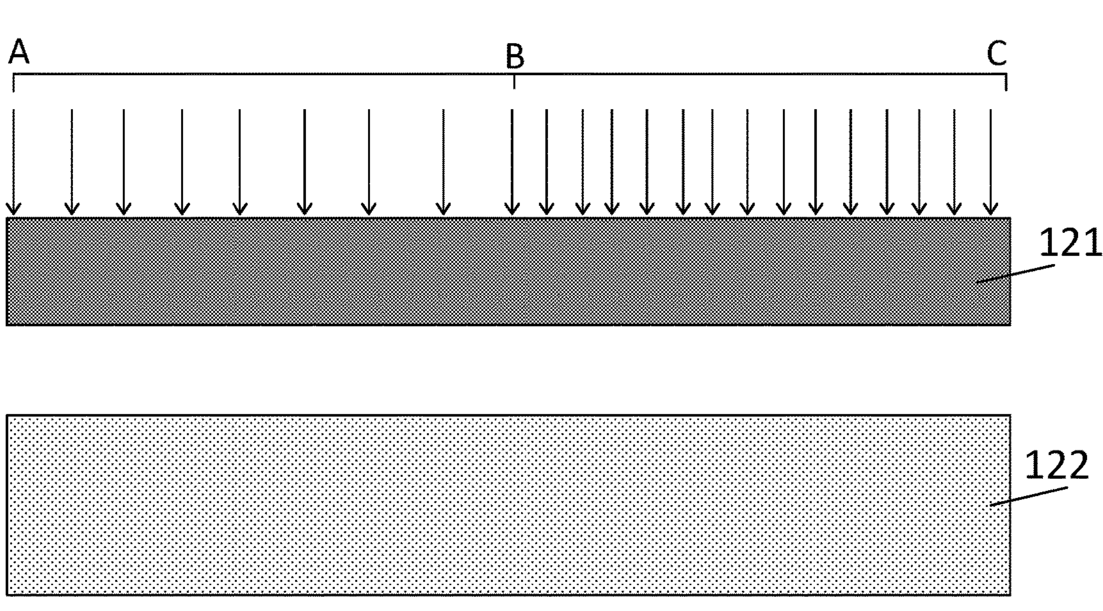
Figures 8B, 9A:
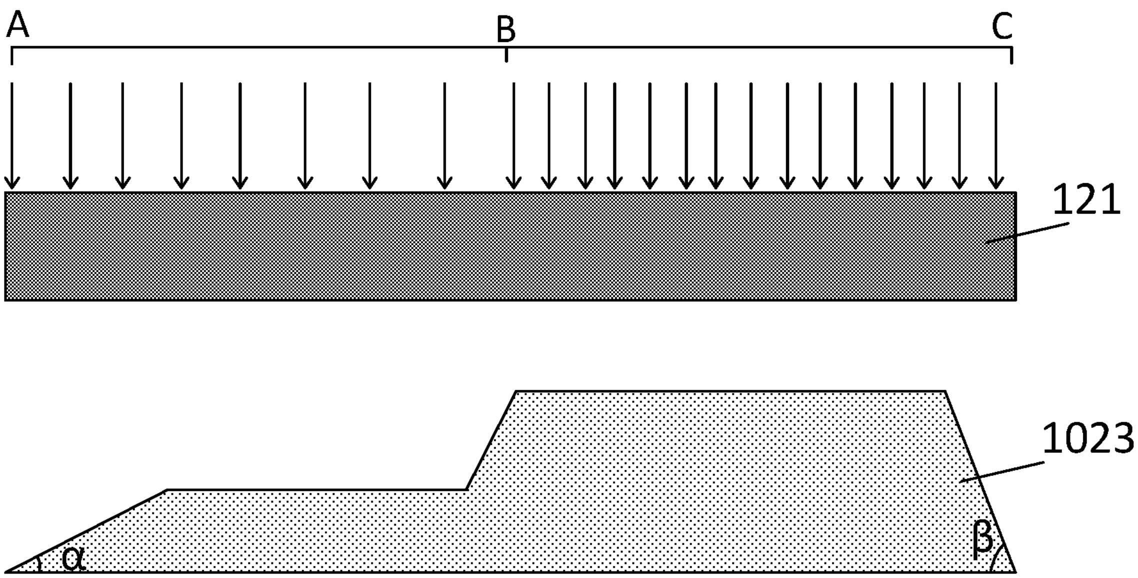

For example, FIGS. 8A-8B are schematic diagrams of a formation process of a pixel defining layer provided by at least one embodiment of the present disclosure. As illustrated by FIG. 8A, forming the pixel defining layer 102 includes: exposing a pixel defining film 122 with a mask plate 121 to block. As illustrated by FIG. 8B, a first opening 1021, a second opening 1022 and a pixel defining structure film layer 123 between the first opening 1021 and the second opening 1022 are formed after the exposure process shown in FIG. 8A is finished. In FIG. 8A, the exposure energy of a part of the pixel defining structure film layer 123 adjacent to the first opening 1021 is smaller than the exposure energy of a part of the pixel defining structure film layer 123 adjacent to the second opening 1022 to form a pixel defining structure precursor 124 with a stepped shape. For example, in one example, the exposure energy of the part of the pixel defining structure film layer 123 adjacent to the first opening 1021 is half that of the part of the pixel defining structure film layer 123 adjacent to the second opening 1022. For example, the exposure of the part of the pixel defining structure film layer 123 adjacent to the first opening 1021 is 50% of the exposure amount, and the exposure of the part of the pixel defining structure film layer 123 adjacent to the second opening 1022 is 100% of the exposure amount. For example. The exposure energy can be changed by setting different slit diffraction.

For example, the patterning process adopting the photolithography process is a photolithography process by using a mask plate for shielding. For example, the one-time patterning process includes the following steps: coating photoresist on a pixel defining film; exposing and developing the photoresist to form a photoresist full-remained region, a photoresist partially-remained region and a photoresist removed region; removing the pixel defining film in the photoresist removed region by a first etching process to form the first opening and the second opening; removing the photoresist in the photoresist partially-remained region by an ashing process; removing a part of the pixel defining film in the photoresist partially-remained region by a second etching process; stripping the photoresist in the photoresist full-remained region to form the pixel defining structure. The photoresist full-remained region corresponds to a platform with a larger thickness in the pixel defining structure precursor with the stepped shape, and the photoresist partially-remained region corresponds to a platform with a smaller thickness in the pixel defining structure precursor with the stepped shape. The photoresist removed region is a region outside the photoresist full-remained area and the photoresist partially-remained region, corresponds to the first opening and the second opening.

For example, in one example, the pixel defining structure precursor 124 can be directly used as the pixel defining structure 1023, which has a stepped structure with a first platform and a second platform directly connected, the height of the first platform is lower than that of the second platform, and the maximum thickness of the first platform where the first included angle $\alpha$ of the pixel defining structure 1023 is located is smaller than the maximum thickness of the second platform where the second included angle $\beta$ of the pixel defining structure 1023 is located. The average thickness of a sharp corner position of the pixel defining structure 1023 corresponding to the first included angle $\alpha$ is smaller than that of the sharp corner position of the pixel defining structure 1023 corresponding to the second included angle $\beta$.

It should be noted that the height of the first platform of the pixel defining structure 1023 refers to the distance between the position of the first platform farthest from the main surface of the base substrate 101 and the main surface of the base substrate 101 in the direction perpendicular to the main surface of the base substrate 101; the height of the second platform of the pixel defining structure 1023 refers to the distance between the position of the second platform farthest from the main surface of the base substrate 101 and the main surface of the base substrate 101 in the direction perpendicular to the main surface of the base substrate 101. The maximum thickness of the first platform where the first included angle $\alpha$ of the pixel defining structure 1023 is located is the maximum distance between the surface of the first platform away from the base substrate 101 and the surface of the first platform close to the base substrate 101. The maximum thickness of the second platform where the second included angle $\beta$ of the pixel defining structure 1023 is located is the maximum distance between the surface of the second platform away from the base substrate 101 and the surface of the second platform close to the base substrate 101. The average thickness of the sharp corner position of the pixel defining structure 1023 corresponding to the first included angle $\alpha$ is an average value of the distances between the hypotenuse of the first included angle $\alpha$ and the surface of the first platform close to the base substrate 101. The average thickness of the sharp corner position of the pixel defining structure 1023 corresponding to the second included angle $\beta$ is an average value of the distances between the hypotenuse of the second included angle $\beta$ and the surface of the second platform close to the base substrate 101.

For example, in another example, the above-mentioned pixel defining structure precursor with the stepped shape needs to undergo a heat treatment to form a non-stepped pixel defining structure. For example, FIGS. 9A-9C are schematic diagrams of a formation process of another pixel defining layer provided by at least one embodiment of the present disclosure. As illustrated by FIG. 9A, the manufacturing method includes: exposing a pixel defining film 122 with a mask plate 121 to block. As illustrated by FIG. 9B, the first opening 1021, the second opening 1022 and the pixel defining structure film layer 123 between the first opening 1021 and the second opening 1022 are formed after the exposure process shown in FIG. 9A is completed, and the exposure energy of a part of the pixel defining structure film layer 123 adjacent to the first opening 1021 is smaller than that of a part of the pixel defining structure film layer 123 adjacent to the second opening 1022 to form a pixel defining structure precursor with a stepped shape. For example, in one example, the exposure energy of the part of the pixel defining structure film layer 123 adjacent to the first opening 1021 is half that of the part of the pixel defining structure film layer 123 adjacent to the second opening 1022. For example, the exposure of the pixel defining structure film layer 123 adjacent to the first opening 1021 is 50% of the exposure amount, and the exposure of the pixel defining structure film layer 123 adjacent to the second opening 1022 is 100% of the exposure amount.

As illustrated by FIG. 9C, the pixel defining structure precursor 124 with the stepped shape is subjected to a heat treatment, which includes: placing the pixel defining structure precursor 124 with the stepped shape having a first temperature in a heating device, and raising the temperature of the pixel defining structure precursor 124 with the stepped shape to a second temperature in the heating device. At this second temperature, the pixel defining structure precursor 124 is in a flowing state and undergoes self-leveling to form a non-stepped pixel defining structure.

For example, as illustrated by FIG. 9C, the first lateral edge 1023$a$ includes a first sub-edge 1023$a$-1 and a second sub-edge 1023$a$-2 which are sequentially arranged in the direction away from the base substrate 101, and the first sub-edge 1023$a$-1 forms a fourth included angle $\alpha\mathbf{1}$ with a plane parallel to the main surface of the base substrate 101, and the second sub-edge 1023$a$-2 forms a fifth included angle $\alpha\mathbf{2}$ with the plane parallel to the main surface of the base substrate 101, and the fourth included angle $\alpha\mathbf{1}$ is smaller than the fifth included angle $\alpha\mathbf{2}$, and the fourth included angle $\alpha\mathbf{1}$ is equal to the first included angle $\alpha$. This design is beneficial to light from the side of the first lateral edge 1023$a$, thus avoiding color shift at a large viewing angle.

For example, FIG. 9D is a schematic cross-sectional structure diagram of a pixel defining layer provided by at least one embodiment of the present disclosure, as illustrated by FIG. 9D, the first lateral edge 1023$a$ includes a first sub-edge 1023$a$-1 and a second sub-edge 1023$a$-2 arranged in sequence in the direction away from the base substrate 101, and the first sub-edge 1023$a$-1 forms a fourth included angle $\alpha\mathbf{1}$ with the plane parallel to the main surface of the base substrate 101, the second sub-edge 1023$a$-2 forms a fifth included angle $\alpha\mathbf{2}$ with the plane parallel to the main surface of the base substrate 101, and the fourth included angle $\alpha\mathbf{1}$ is smaller than the fifth included angle $\alpha\mathbf{2}$, and the fifth included angle $\alpha\mathbf{2}$ is equal to the first included angle $\alpha$. This design is also beneficial to light from the side of the first lateral edge 1023$a$, so that color shift at a large viewing angle can be avoided.

For example, the heating device may be a device with programmed temperature rise such as an oven, or a device with heating function such as a muffle furnace, which is not limited by the embodiment of the present disclosure.

Figure 10B:
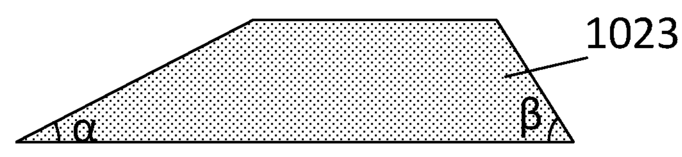

For example, FIGS. 10A-10B are schematic diagrams of a formation process of another pixel defining layer provided by at least one embodiment of the present disclosure. As illustrated by FIG. 10A, forming the pixel defining layer 102 includes: forming a first opening 1021, a second opening 1022 and a pixel defining structure film layer 123 formed between the first opening 1021 and the second opening 1022 by a first patterning process. As illustrated by FIG. 10B, a second patterning process is performed on a part of the pixel defining structure film layer 123 adjacent to the second opening 1022 to form the pixel defining structure 1023, that is, the formation of the pixel defining structure in this example needs to be completed by two patterning processes.

For example, both the first patterning process and the second patterning process include a photolithography process using a mask plate. For example, the one-time patterning process includes the following steps: coating photoresist on a pixel defining film; exposing and developing the photoresist to form a photoresist remained region and a photoresist removed region; removing the pixel defining film in the photoresist removed region by an etching process, stripping the photoresist in the photoresist remained region, so as to form the first opening, the second opening and the pixel defining structure film layer between the first opening and the second opening; coat photoresist on that pixel defining structure film layer; exposing and developing the photoresist to form a photoresist remained region and a photoresist removed region; removing the pixel defining structure film layer in the photoresist removed region by an etching process, and stripping the photoresist in the photoresist remained region, that is, a second patterning process is performed on a part of the pixel defining film layer adjacent to the second opening to form the pixel defining structure, that is, the formation of the pixel defining structure in this example needs to be completed by two patterning processes.

For example, the photoresist can be coated by spin coating, blade coating or roll coating.

For example, in other examples, other inorganic layers can be formed on the planarization layer and the pixel defining layer as a hard mask to pattern regions with small angles. Through experiments, it is found that the hard mask has a higher etching selectivity for organic materials than photoresist, which is more conducive to achieving a large angle. It is verified that the large angle can be 90 degrees or even greater than 90 degrees when using the hard mask.

For example, in other examples, the planarization layer and the pixel defining layer in a large-angle region can also be removed by laser irradiation, in which the main surface of the base substrate is downward, the laser source is located below the base substrate, and the planarization layer and the pixel defining layer in the large-angle region requiring laser irradiation are removed by using a mask plate with an opening. The way of laser irradiation to remove the planarization layer and the pixel defining layer can achieve a large angle, for example, the range of this large angle can be 69° to 90°.

The organic light emitting diode display panel, the manufacturing method thereof, and the display device provided by at least one embodiment of the present disclosure have at least one of the following beneficial technical effects:

(1) In the organic light emitting diode display panel provided by at least one embodiment of the present disclosure, the first included angle between the first lateral edge of the pixel defining structure adjacent to the first opening and the plane parallel to the main surface of the base substrate is smaller than the second included angle between the second lateral edge of the pixel defining structure adjacent to the second opening and the plane parallel to the main surface of the base substrate, so as to simultaneously solve the problem of resolution reduction and the problem of color shift in the light mixing process which are caused by the arrangement of the auxiliary electrode.

(2) In the transparent display device provided by at least one embodiment of the present disclosure, by increasing the second included angle between the second lateral edge of the pixel defining structure adjacent to the second opening and the plane parallel to the main surface of the base substrate, the area of the light-transmitting region can be increased to increase the space ratio of the light-transmitting region, so that the overall transmittance of the transparent display device can be increased, and by keeping the first included angle between the first lateral edge of the pixel defining structure adjacent to the first opening and the plane parallel to the main surface of the base substrate relatively small, the risk of color shift of the display region can be reduced, so as to improve the quality of the display device.

(3) In the organic photoelectric sensing device with display function provided by at least one embodiment of the present disclosure, the first included angle between the first lateral edge of the pixel defining structure adjacent to the first opening and the plane parallel to the main surface of the base substrate is smaller than the second included angle between the second lateral edge of the pixel defining structure adjacent to the second opening and the plane parallel to the main surface of the base substrate, the area of the sensing device can be increased to increase the amount of light signal on the basis of not reducing the area of the display region, further, by keeping the first included angle between the first lateral edge of the pixel defining structure adjacent to the first opening and the plane parallel to the main surface of the base substrate relatively small, the risk of color shift in the light mixing process can be reduced.

The following points need to be explained:

(1) The drawings of the embodiment of this disclosure only relate to the structure related to the embodiment of this disclosure, and other structures can refer to the general design.

(2) For the sake of clarity, in the drawings used to describe the embodiments of the present disclosure, the thicknesses of layers or regions are enlarged or reduced, that is, these drawings are not drawn to actual scale.

(3) In the case of no conflict, the embodiments of the present disclosure and the features in the embodiments can be combined with each other to obtain a new embodiment.

The above is only the specific implementation of this disclosure, but the scope of protection of this disclosure is not limited thereto, and the scope of protection of this disclosure should be subject to the scope of protection of the claims.

The invention claimed is:

1. An organic light emitting diode display panel, comprising:

a base substrate; and a pixel defining layer, arranged on the base substrate, wherein the pixel defining layer comprises a first opening, a second opening and a pixel defining structure between the first opening and the second opening, the first opening is provided with a light emitting layer and a first electrode which are stacked, and the second opening is not provided with the light emitting layer, a first lateral edge of the pixel defining structure adjacent to the first opening forms a first included angle with a plane parallel to a main surface of the base substrate, and a second lateral edge of the pixel defining structure adjacent to the second opening forms a second included angle with the plane parallel to the main surface of the base substrate, and the first included angle is smaller than the second included angle, and wherein an auxiliary electrode electrically connected with the first electrode is arranged in the second opening, the first electrode extends from the first opening to the second opening, and the first electrode is spaced apart from the auxiliary electrode in the second opening.

2. The organic light emitting diode display panel according to claim 1, wherein at least one side of the first electrode located in the second opening away from the base substrate is provided with a metal oxide conductive layer, and the metal oxide conductive layer covers at least a lateral surface of the auxiliary electrode, so that the first electrode and the auxiliary electrode are electrically connected through the metal oxide conductive layer.

3. The organic light emitting diode display panel according to claim 2, wherein the first electrode is at a side of the light emitting layer away from the base substrate, and the metal oxide conductive layer is arranged at a side of the first electrode away from the base substrate in the first opening and the second opening, and the metal oxide conductive layer extends from the first opening to the second opening, and covers a lateral surface of the auxiliary electrode and a surface of the auxiliary electrode away from the base substrate.

4. The organic light emitting diode display panel according to claim 3, wherein a second electrode is arranged at a side of the light emitting layer close to the base substrate, a thin film transistor is arranged at a side of the second electrode close to the base substrate, and a planarization layer is arranged between the second electrode and the thin film transistor, and the second electrode is electrically connected with a first source-drain electrode of the thin film transistor through a first via hole structure arranged in the planarization layer.

5. The organic light emitting diode display panel according to claim 4, wherein the planarization layer is arranged in the second opening, and the auxiliary electrode is arranged at a side of the planarization layer away from the base substrate.

6. The organic light emitting diode display panel according to claim 4, wherein a thickness of the planarization layer in a direction perpendicular to the base substrate is greater than a thickness of the pixel defining layer in the direction perpendicular to the base substrate, and a lateral edge of the planarization layer adjacent to the second opening forms a third included angle with a plane parallel to the main surface of the base substrate, and the third included angle is greater than the second included angle.

7. The organic light emitting diode display panel according to claim 4, wherein a lateral edge of the planarization layer adjacent to the second opening forms a third included angle with a plane parallel to the main surface of the base substrate, and the third included angle is equal to the second included angle.

8. The organic light emitting diode display panel according to claim 4, wherein a distance between a part of an orthographic projection of the lateral edge of the planarization layer adjacent to the second opening on the base substrate farthest from the first opening and a part of an orthographic projection of the second lateral edge of the pixel defining structure on the base substrate farthest from the first opening is greater than 0.

9. The organic light emitting diode display panel according to claim 2, wherein a first sub-electrode is arranged between the auxiliary electrode and the metal oxide conductive layer, and the first sub-electrode and the first electrode are formed in the same process step.

10. The organic light emitting diode display panel according to claim 9, wherein, in the first opening, a first organic functional layer is arranged at a side of the first electrode close to the base substrate, the first organic functional layer extends from the first opening to the second opening, and the first organic functional layer and the auxiliary electrode are spaced part from each other in the second opening, a second organic functional layer is arranged at a side of the auxiliary electrode away from the base substrate, and the first organic functional layer and the second organic functional layer are formed in the same process step.

11. The organic light emitting diode display panel according to claim 1, wherein the first lateral edge comprises a first sub-edge and a second sub-edge which are sequentially arranged in a direction away from the base substrate, and the first sub-edge forms a third included angle with a plane parallel to the main surface of the base substrate, and the second sub-edge forms a fourth included angle with a plane parallel to the main surface of the base substrate, and the third included angle is greater than the fourth included angle, the third included angle is equal to the first included angle.

12. The organic light emitting diode display panel according to claim 1, wherein the first included angle ranges from 20° to 40°, and the second included angle ranges from 65° to 90°.

13. The organic light emitting diode display panel according to claim 1, wherein the second opening is a transparent display region, and the pixel defining layer is not provided in the second opening.

14. The organic light emitting diode display panel according to claim 1, wherein a fingerprint recognition sensor is arranged in the second opening.

15. A display device, comprising the organic light emitting diode display panel according to claim 1.

16. A manufacturing method of an organic light emitting diode display panel, comprising:

providing a base substrate;

forming a pixel defining layer on the base substrate, wherein the pixel defining layer comprises a first opening, a second opening and a pixel defining structure between the first opening and the second opening; and sequentially forming a light emitting layer and a first electrode in the first opening, wherein the second opening is not provided with the light emitting layer, a first lateral edge of the pixel defining structure adjacent to the first opening forms a first included angle with a plane parallel to a main surface of the base substrate, and a second lateral edge of the pixel defining structure adjacent to the second opening forms a second included angle with the plane parallel to the main surface of the base substrate, and the first included angle is smaller than the second included angle, the method further comprising forming an auxiliary electrode electrically connected with the first electrode in the second opening, wherein the first electrode extends from the first opening to the second opening, and the first electrode is spaced apart from the auxiliary electrode in the second opening.

17. The manufacturing method according to claim 16, wherein forming the pixel defining layer comprises exposing a pixel defining film by using a mask plate to form the first opening, the second opening and a pixel defining structure film layer between the first opening and the second opening, and an exposure energy of a part of the pixel defining structure film layer adjacent to the first opening is smaller than an exposure energy of a part of the pixel defining structure film layer adjacent to the second opening to form a pixel defining structure precursor with a stepped shape.

18. The manufacturing method according to claim 17, further comprising: performing a heat treatment on the pixel defining structure precursor with the stepped shape, wherein the heat treatment comprises placing the pixel defining structure precursor with the stepped shape having a first temperature in a heating device, and raising the temperature of the pixel defining structure precursor to a second temperature in the heating device.

* * * * *